US009755656B2

(12) United States Patent
Kim

(10) Patent No.: US 9,755,656 B2
(45) Date of Patent: Sep. 5, 2017

(54) DIGITAL PROTECTIVE RELAY

(71) Applicant: LSIS CO., LTD., Anyang-si, Gyeonggi-do (KR)

(72) Inventor: Jiung Kim, Anyang-si (KR)

(73) Assignee: LSIS CO., LTD., Anyang-si (KR)

( * ) Notice: Subject to any disclaimer, the term of this patent is extended or adjusted under 35 U.S.C. 154(b) by 0 days.

(21) Appl. No.: 15/003,728

(22) Filed: Jan. 21, 2016

(65) Prior Publication Data

US 2016/0233876 A1    Aug. 11, 2016

(30) Foreign Application Priority Data

Feb. 6, 2015    (KR) .................. 10-2015-0018839

(51) Int. Cl.
| | | |
|---|---|---|
| H03K 5/00 | (2006.01) | |
| H02H 3/00 | (2006.01) | |
| H03M 1/12 | (2006.01) | |
| H02H 1/00 | (2006.01) | |
| H02H 1/04 | (2006.01) | |
| H02H 3/52 | (2006.01) | |
| G01R 19/02 | (2006.01) | |
| G01R 19/25 | (2006.01) | |

(52) U.S. Cl.
CPC .............. *H03M 1/12* (2013.01); *G01R 19/02* (2013.01); *H02H 1/0092* (2013.01); *H02H 1/04* (2013.01); *H02H 3/52* (2013.01); *G01R 19/2509* (2013.01)

(58) Field of Classification Search
CPC ..... H03M 1/12; G01R 19/02; G01R 19/2509; H02H 1/0092; H02H 1/04
USPC ........... 327/348, 62, 58, 14, 551; 361/62–66
See application file for complete search history.

(56) References Cited

U.S. PATENT DOCUMENTS

| | | | |
|---|---|---|---|
| 6,324,168 B1 * | 11/2001 | Richardson | ............ G01R 31/11 370/241 |
| 9,250,283 B2 * | 2/2016 | Johnson | ............... G01R 31/021 |
| 2006/0203401 A1 | 9/2006 | Kojori et al. | |
| 2012/0126771 A1 | 5/2012 | Tuten | |

FOREIGN PATENT DOCUMENTS

| | | |
|---|---|---|
| EP | 2355288 | 8/2011 |
| KR | 10-1064454 | 9/2011 |

OTHER PUBLICATIONS

European Patent Office Application Serial No. 16152272.7, Search Report dated Jun. 8, 2016, 7 pages.

\* cited by examiner

*Primary Examiner* — Dinh T Le
(74) *Attorney, Agent, or Firm* — Lee, Hong, Degerman, Kang & Waimey PC

(57) ABSTRACT

The present disclosure relates to provide an active erroneous sample elimination device or erroneous sample elimination method for a relay capable of correctly implementing erroneous sample elimination processing even during a plurality of electrical disturbances mixed with an electrical quantity detection signal, and a digital protective relay according to the present disclosure may include a converter that samples an analog signal and converts the sampled signal to a digital signal; and a processor that searches an inflection point at which an electrical variation quantity varies from an increase to a decrease or from a decrease to an increase based on the digital signal, and compares an electrical variation quantity prior to and subsequent to the inflection point with a preset electrical quantity.

5 Claims, 4 Drawing Sheets

DIGITAL PROTECTIVE RELAY

CROSS-REFERENCE TO RELATED APPLICATIONS

Pursuant to 35 U.S.C. §119(a), this application claims the benefit of earlier filing date and right of priority to Korean Patent Application No. 10-2015-0018839, filed on Feb. 6, 2015, the contents of which are hereby incorporated by reference herein in its entirety.

BACKGROUND OF THE INVENTION

1. Field of the Invention

The present disclosure relates to a digital protective relay, and more particularly, to a digital protective relay capable of preventing an erroneous operation according to the influence of noise such as disturbance or harmonic wave.

2. Description of the Related Art

A digital protective relay, as a measuring and relaying device for outputting a control signal of breaking a circuit when various power faults such as overcurrent, short-circuit fault, ground fault, and the like occur on an electrical power line to a circuit breaker to break the circuit, thereby protecting a grid from various power faults, is a device using a microprocessor and capable of implementing a high-performance protective algorithm that has been unable to be implemented in an induction type or static type relay in the related art. Furthermore, the digital protective relay has various additional functions such as a self diagnostic function, a fault recording function, and the like, thereby facilitating a fault analysis as well as providing high reliability. For a circuit configuration example of such a digital protective relay according to the related art, the following patent disclosure disclosed by the applicant of the present disclosure is described below for reference.

(Patent Document 1) KR10-0146088 B1

In order to prevent an erroneous operation according to the influence of noise such as disturbance or harmonic wave in addition to a circuit configuration according to the Patent Document 1, an erroneous sample elimination algorithm may be mounted on a program storage unit (program storage memory) of a microprocessor in a digital protective relay as a program to eliminate noise and extract only aimed measurement signals on an electric power line.

SUMMARY OF THE INVENTION

An object of the present disclosure is to provide a digital protective relay capable of distinguishing and processing electrical disturbances and harmonic waves mixed with electrical quantity detection signals, respectively.

Another object of the present disclosure is to provide a noise elimination method of a digital protective relay capable of distinguishing and processing electrical disturbances and harmonic waves mixed with electrical quantity detection signals, respectively.

The foregoing, an object of the present disclosure may be accomplished by providing a digital protective relay according to the present disclosure, the digital protective relay comprising: a converter that samples an analog signal and converts a sampled analog signal to a digital signal; and a processor that searches an inflection point at which an electrical variation quantity varies from an increase to a decrease or from a decrease to an increase based on the digital signal, and compares an electrical variation quantity prior to and subsequent to the inflection point with a preset electrical quantity.

Another object of the present disclosure may be accomplished by providing a noise elimination method for a digital relay according to the present disclosure, the method comprising:

a sampling and analog-digital conversion step that allows an analog-digital converter to sample an analog signal of an electrical quantity detection signal and convert a sampled analog signal to a digital signal;

an inflection point search step that searches an inflection point at which an electrical variation quantity varies from an increase to a decrease or from a decrease to an increase based on the digital signal by a processor;

a variation quantity comparison step that compares an electrical variation quantity prior to and subsequent to the inflection point with a predetermined normal reference electrical variation quantity by the processor; and an electrical disturbance elimination step that determines the digital signal as an electrical disturbance and substitutes an electrical quantity data at the inflection point with an electrical quantity data prior to a predetermined period by the processor in case where an electrical variation quantity prior to and subsequent to the inflection point is not less than a predetermined normal reference electrical variation quantity during the variation quantity comparison step.

According to a preferred aspect of the present disclosure, the processor is configured to perform a Discrete Time Fourier Transform on the digital signal for a predetermined period of time, to compare a value at which a transformed value is increased and then converged with a predetermined normal convergence value, to determine the digital signal as a harmonic wave when a difference between the constantly converged transformed value and the predetermined normal convergence value exceeds a predetermined difference, and to determine the digital signal as an electrical disturbance when the difference between the constantly converged transformed value and the predetermined normal convergence value is larger or equal to a reference electrical variation quantity.

According to another preferred aspect of the present disclosure, the processor the processor is configured to perform a root mean square processing on the digital signal when the digital signal is determined as the harmonic wave.

According to still another preferred aspect of the present disclosure, the processor is configured to substitute an electrical quantity data at the inflection point with an electrical quantity data prior to a predetermined period when the digital signal is determined as the electrical disturbance.

According to yet still another preferred aspect of the present disclosure, a noise elimination method for a digital relay according to the present disclosure further comprises a Discrete Time Fourier Transform convergence value comparison step of performing a Discrete Time Fourier Transform on the digital signal for a predetermined period of time, and comparing a value at which the transformation value is increased and then converged with a predetermined normal convergence value by the processor; and a harmonic wave determination and processing step of determining that a harmonic wave is mixed with an electrical quantity detection signal to perform root mean square processing on the digital signal when a difference between the converged value and the normal convergence value exceeds a predetermined difference during the Discrete Time Fourier Transform convergence value comparison step.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

The objective of the present invention, as well as the configuration and working effect thereof to accomplish the foregoing objective will be more clearly understood by the following description for the preferred embodiments of present disclosure with reference to the accompanying drawings.

First, the configuration of a digital relay according to a preferred embodiment of the present disclosure will be described with reference to FIG. 1.

Figure 1:
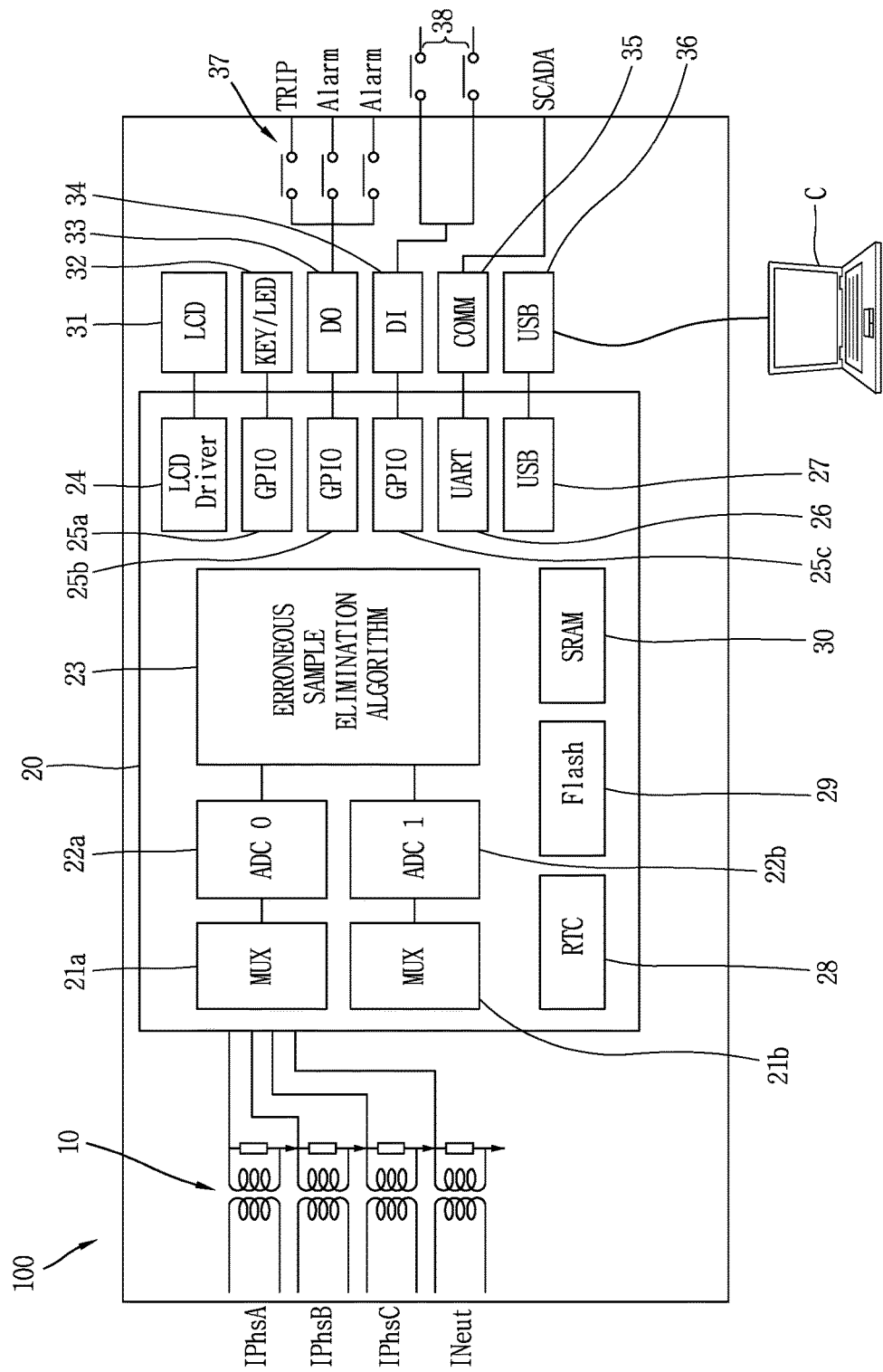
FIG. 1 is a block diagram illustrating the configuration of a digital relay according to a preferred embodiment of the present disclosure.

Referring to FIG. 1, a digital relay according to a preferred embodiment of the present disclosure comprises an Analog-Digital Converter (abbreviated as ADC hereinafter) 22*a*, 22*b* and a processor 23.

The ADC 22*a*, 22*b* comprises a first ADC (ADC 0) 22*a* and a second ADC (ADC 1) 22*b* in FIG. 1.

Each of the ADC 22*a*, 22*b* is a circuit unit capable of sampling an analog signal of an electrical quantity detection signal and converting into a digital signal and providing the digital signal. According to an embodiment, the first ADC (ADC 0) 22*a* may be a circuit unit capable of sampling a current detection signal for each phase of an object to be monitored (an electric power circuit as an object to be monitored) and converting into a digital signal and providing the digital signal, and the second an ADC (ADC 1) 22*b* may be a circuit unit capable of sampling a voltage detection signal for each phase of the object to be monitored and converting into a digital signal and providing the digital signal.

The processor 23 can be configured with a microprocessor, and is a computing and processing unit configured to search an inflection point at which an electrical variation quantity varies from an increase to a decrease or from a decrease to an increase based on the digital signal, and determine the digital signal as an electrical disturbance to substitute electrical quantity data at the inflection point with normal electrical quantity data prior to a predetermined period (for instance, prior to one period) when an electrical variation quantity prior to and subsequent to the inflection point is not less than a predetermined normal reference electrical variation quantity. In other words, the processor 23 may include a program storage memory having an algorithm of searching an inflection point, an algorithm of determining an electrical disturbance and an algorithm of substituting with normal electrical quantity data, and a central processing unit of reading a processing algorithm from the relevant memory to perform the processing on the digital signal.

The processor 23 is configured to perform a Discrete time Fourier Transform (hereinafter, abbreviated as "DFT") on the digital signal for a predetermined period of time, and compare a value at which the transformation value is increased and then converged with a predetermined normal convergence value (refer to FIG. 5), and determine it as a harmonic wave, namely, determine that a harmonic wave is mixed with an electrical quantity detection signal when the digital signal is determined as a harmonic wave when a difference between the converged value and the predetermined normal convergence value exceeds a predetermined difference, and perform root mean square (commonly referred to as "RMS") processing on the digital signal. In other words, the processor 23 may include a program storage memory having an algorithm of the DFT and comparing convergence values, an algorithm of determining harmonic wave mixing, and a root mean square processing algorithm, and a central processing unit for reading the relevant memory to perform the processing on a digital signal.

FIG. 1 illustrates a digital relay including a controller 20 according to a preferred embodiment of the present invention. Reference numeral 100 in FIG. 1 indicates a digital relay including the controller 20.

In FIG. 1, reference symbol IPhsA represents an A-phase (namely, R-pole) current detection signal of a 4-poles (4-phases) alternating current circuits, and reference character IPhsB represents an B-phase (namely, S-pole) current detection signal of the 4-poles (4-phases) alternating current circuits, and reference character IPhsC represents an C-phase (namely, T-pole) current detection signal of the 4-poles (4-phases) alternating current circuits, and reference character INeut represents an N-phase (namely, neutral pole) current detection signal of the 4-phases (4-poles) alternating current circuit.

Reference numeral 10 designates a transformer unit for converting the current detection signal for each phase to a voltage signal with a small signal that can be processed by a digital circuit and a processor.

Reference numeral 21*a* is a first multiplexer circuit unit for selectively providing any one of the four current detection signals for four phases, and reference numeral 21*b* is a second multiplexer circuit unit for selectively providing any one of four voltage detection signals for four phases (not shown).

Reference numeral 24 designates a driving circuit unit for driving a liquid crystal display, and reference numeral 25*a* designates a first input/output interface unit for inputting an input of a key switch and outputting an output signal (control signal) of a light emitting diode, and reference numeral 25*b* as an output interface circuit unit of a trip control signal of a circuit breaker, alarm signals output from a digital relay 100 designates a second input/output interface unit. Reference numeral 25*c* designates a third input/output interface unit for receiving digital input according to a selective manipulation of an input switch.

Reference numeral 26 designates a universal asynchronous receiver transmitter (typically, can be abbreviated as a "UART") circuit unit, and reference numeral 27 designates a universal serial bus interface unit (namely, so called USB interface unit), and reference numeral 28 designates a real time clock for providing real time clock information, and reference numeral 29 designates a flash memory for storing a processing program or data, and reference numeral 30 designates a S-RAM for storing data during supplying of electric power.

Reference numeral 31 designates a liquid crystal display as a display circuit unit, and reference numeral 32 designates a key switch and a light emitting diode as an input/output means, and reference numeral 33 designates a digital output port, and reference numeral 34 designates a digital input port, and reference numeral 35 designates a communication unit with a supervisory device such as an external remote monitoring apparatus (for example Supervisory Control and Data Acquisition system), and reference numeral 36 designates a USB port (universal serial bus port) capable of accessing a personal terminal capable of inputting and outputting data such as a keypad, and reference numeral 37 designates an output relay contacts, and reference numeral 38 designates an input switch unit.

Figure 4:
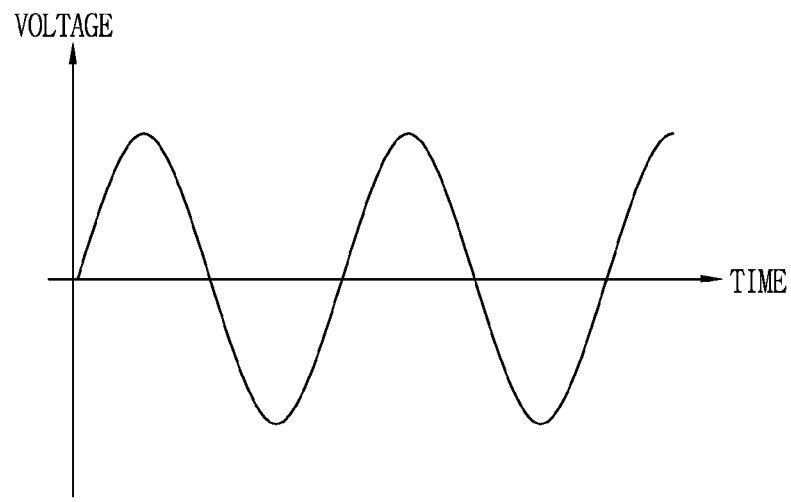
FIG. 4 is a waveform diagram illustrating a normal waveform of an electrical quantity detection signal in a digital relay according to a preferred embodiment of the present disclosure.

The operation of the foregoing digital relay according to a preferred embodiment of the present invention and the foregoing noise elimination method of the foregoing digital relay according to a preferred embodiment of the present invention will be mainly described with reference to a flow chart, and supplementally described with reference to FIGS. 1, 4 and 5.

Figure 2:
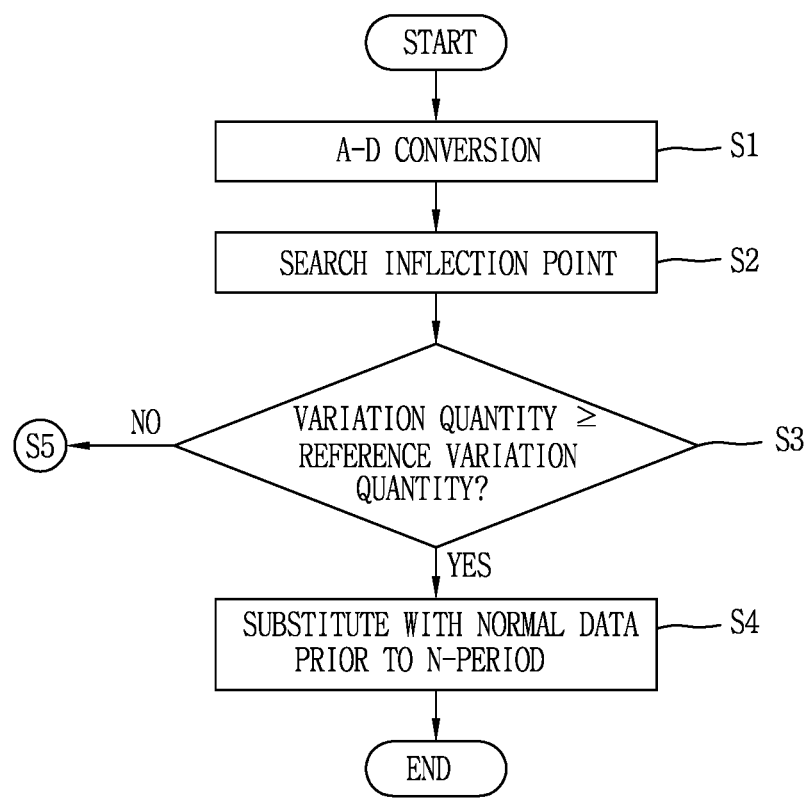
FIG. 2 is a flow chart illustrating an operation flow of a digital relay according to a preferred embodiment of the present disclosure.

Referring to FIG. 2, the first ADC (ADC 0) 22*a* in a digital relay according to a preferred embodiment of the present disclosure may sample a current detection signal (refer to FIG. 4) for each phase for a relay object (that is AC circuit as a monitoring target) and convert into a digital signal and provide the digital signal (sampling and analog-digital conversion step S1).

Then, the processor 23 searches an inflection point at which an electrical variation quantity varies from an increase to a decrease or from a decrease to an increase based on the digital signal (inflection point search step S2).

Then, the processor 23 compares an electrical variation quantity prior to and subsequent to the inflection point with a predetermined normal reference electrical variation quantity (variation quantity comparison step S3).

When an electrical variation quantity prior to and subsequent to the inflection point are not less than a predetermined normal reference electrical variation quantity during the variation quantity comparison step (S3), namely, when the electrical variation quantity prior to or subsequent to the inflection point is equal to or larger than a reference electrical variation quantity, the processor 23 determines the digital signal as an electrical disturbance (namely, determines that a disturbance exists on the detected digital signal) to substitute electrical quantity data at the inflection point with electrical quantity data prior to a predetermined period (for instance, normal electrical quantity data prior to one period) (electrical disturbance elimination step S4).

Figure 3:
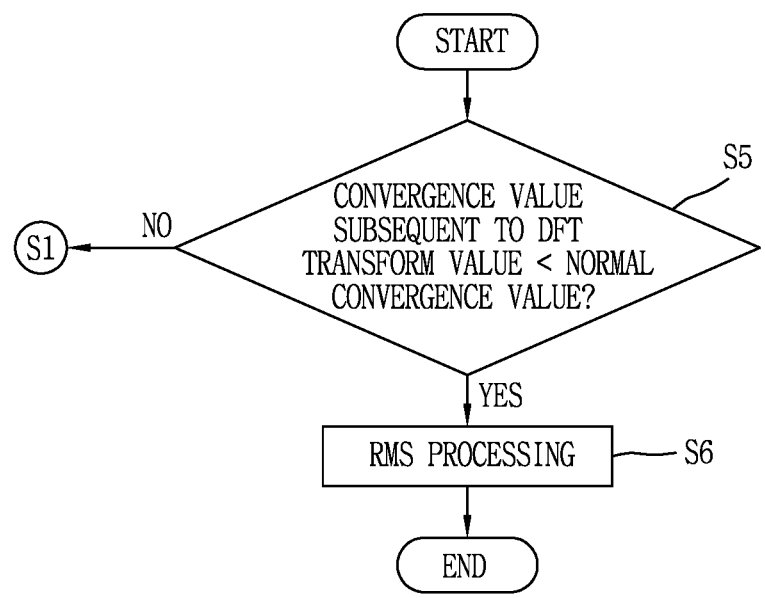
FIG. 3 is a flow chart illustrating a method of eliminating a harmonic wave noise or operation flow in a digital relay according to a preferred embodiment of the present disclosure.

When an electrical variation quantity prior to and subsequent to the inflection point are less than the predetermined normal reference electrical variation quantity during the variation quantity comparison step (S3), operation proceeds to the step S5 on a flow chart illustrated in FIG. 3 to determine whether or not a harmonic wave is mixed therewith.

On the other hand, the present disclosure will be described with reference to FIG. 3, which is a flow chart illustrating a method of eliminating a harmonic wave noise or operation flow of an apparatus according to the present disclosure.

Figure 5:
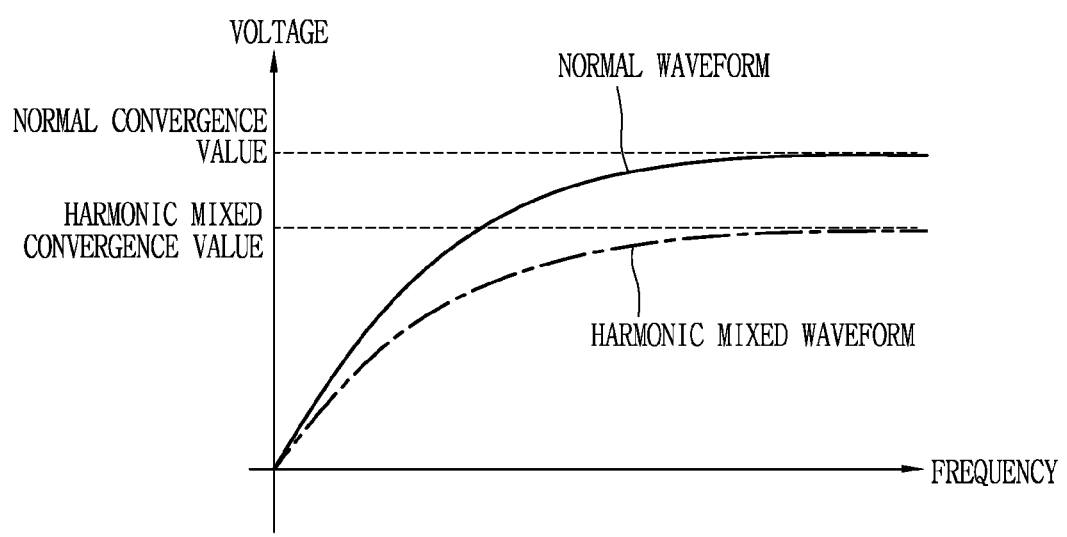
FIG. 5 is a waveform diagram illustrating a waveform of an electrical quantity detection signal subsequent to DFT processing in a digital relay according to a preferred embodiment of the present disclosure in which a normal waveform and a harmonic wave mixed waveform are shown together.

In order to check whether or not a harmonic wave is mixed with the detected electrical quantity signal, it is required to execute Discrete time Fourier Transform, namely, DFT, on digital signals sampled and entered through the first ADC (ADC 0) 22*a* for a predetermined period of time to compare a value at which the transformation value is increased and then converged with a normal convergence value as illustrated in FIG. 5.

When a harmonic wave is mixed with the detected electrical quantity signal, a convergence value is smaller compared to a normal convergence value. Accordingly, whether or not a harmonic wave is mixed with the electrical quantity signal can be determined using this characteristics.

The processor 23 executes DFT processing on the sampled and entered digital signals to determine whether or not a harmonic wave is mixed with the detected electrical quantity signal to compare the convergence value with a normal convergence value as illustrated in FIG. 5 (DFT conversion value comparison step S5).

When a difference between the converged value and the normal conversion value exceeds a predetermined difference during the DFT conversion value comparison step (S5), for instance, when a convergence value subsequent to DFT is less or greater than a predetermined difference compared to the normal convergence value, the processor 23 determines that a harmonic wave is mixed with an electrical quantity detection signal and performs root mean square processing on the digital signal to eliminate harmonic wave noise (harmonic wave determination and processing step S6).

As described above, according to a digital relay according to the present disclosure or a noise elimination method thereof, an electrical variation quantity prior to and subsequent to an inflection point may be compared to a predetermined normal reference electrical variation quantity to determine the digital signal as an electrical disturbance when the electrical variation quantity prior to and subsequent to an inflection point is not less than the predetermined normal reference electrical variation quantity so as to substitute electrical quantity data at the inflection point with electrical quantity data prior to a predetermined period, thereby having an advantage capable of effectively eliminating a plurality of electrical disturbances even when mixed with an electrical quantity detection signal.

According to a digital relay according to the present disclosure or a noise elimination method thereof, when a harmonic wave is mixed with an electrical quantity detection signal, the harmonic wave may be eliminated by root mean square processing, thereby providing an advantage capable of effectively eliminating harmonic wave noise.

What is claimed is:
1. A digital protective relay, comprising:
a converter configured to sample an analog signal and convert the sampled analog signal to a digital signal; and
a processor configured to:
search an inflection point at which an electrical variation quantity varies from an increase to a decrease or from a decrease to an increase based on the digital signal, wherein the electrical variation quantity comprises at least one of current variation amount or voltage variation amount;

compare the electrical variation quantity prior to and subsequent to the inflection point with a preset electrical quantity; and substitute electrical quantity data at the inflection point with electrical quantity data prior to a predetermined period when the digital signal is determined as an electrical disturbance.

2. The digital protective relay of claim 1, wherein the processor is further configured to:

perform a Discrete Time Fourier Transform on the digital signal for a predetermined period of time;

compare a first convergence value at which a transformed value is increased and then converged with a predetermined normal convergence value;

determine the digital signal as a harmonic wave when a difference between the first convergence value and the predetermined normal convergence value exceeds a predetermined difference; and determine the digital signal as the electrical disturbance when the electrical variation quantity is larger or equal to a reference electrical variation quantity.

3. The digital protective relay of claim 2, wherein the processor is further configured to perform a root mean square processing on the digital signal when the digital signal is determined as the harmonic wave.

4. A noise elimination method for a digital relay, the method comprising:

sampling an analog signal of an electrical quantity detection signal and converting the sampled analog signal to a digital signal;

searching an inflection point at which an electrical variation quantity varies from an increase to a decrease or from a decrease to an increase based on the digital signal by a processor, wherein the electrical variation quantity comprises at least one of current variation amount or voltage variation amount;

comparing the electrical variation quantity prior to and subsequent to the inflection point with a predetermined normal reference electrical variation quantity by the processor; and substituting an electrical quantity data at the inflection point with an electrical quantity data prior to a predetermined period by the processor when the digital signal is determined as an electrical disturbance where an electrical variation quantity prior to and subsequent to the inflection point is not less than a predetermined normal reference electrical variation quantity.

5. The method of claim 4, further comprising:

performing a Discrete Time Fourier Transform on the digital signal for a predetermined period of time;

comparing a first convergence value at which a transformed value is increased and then converged with a predetermined normal convergence value;

determining that a harmonic wave is mixed with an electrical quantity detection signal to perform root mean square processing on the digital signal when a difference between the first convergence value and the normal convergence value exceeds a predetermined difference.

* * * * *